United States Patent [19]
Davis

[11] Patent Number: 5,528,201
[45] Date of Patent: Jun. 18, 1996

[54] PIERCE CRYSTAL OSCILLATOR HAVING RELIABLE STARTUP FOR INTEGRATED CIRCUITS

[75] Inventor: Timothy D. Davis, Arlington, Tex.

[73] Assignee: National Semiconductor Corporation, Santa Clara, Calif.

[21] Appl. No.: 414,464

[22] Filed: Mar. 31, 1995

[51] Int. Cl.$^6$ ..................................................... H03B 5/36
[52] U.S. Cl. ........................... 331/116 FE; 331/116 R; 331/117 FE
[58] Field of Search ....................... 331/116 FE, 117 FE, 331/107 R, 108 R, 117 R, 109, 115, 116 R

[56] References Cited

U.S. PATENT DOCUMENTS

| | | | |
|---|---|---|---|
| 3,965,442 | 6/1976 | Eaton | 331/116 R |
| 3,979,698 | 9/1976 | Gollinger | 331/116 R |

FOREIGN PATENT DOCUMENTS

| | | |
|---|---|---|
| 70746 | 6/1978 | Japan . |
| 131744 | 11/1978 | Japan . |

OTHER PUBLICATIONS

Mark A. Unkrich and Robert G. Meyer, *Conditions for Start–up in Crystal Oscillators*, IEEE Journal of Solid–State Circuits, vol. SC–17, No. 1., pp. 87–90, (Feb. 1982).

Practical Aspects of Analog and Mixed–Mode IC Design (Course Materials), vol. 1, title page and pp. LP–36 to LP–38 (4 pages), (Jul. 1994).

E. Vittoz et al. "*High–Performance Crystal Oscillator Circuits: Theory and Application* ", IEEE J. Solid–State Circuits, vol. 23, pp. 774–783, (Jun. 1988).

David K. Cheng, "*Analysis of Linear Systems*", Addison––Wesley Publishing Company, Inc., title page and pp. 280–283, (1961).

*Primary Examiner*—Robert Pascal
*Assistant Examiner*—David H. Vu
*Attorney, Agent, or Firm*—Skjerven, Morrill, MacPherson, Franklin & Friel; T. Lester Wallace

[57] ABSTRACT

A Pierce crystal oscillator circuit for a digital integrated circuit has a capacitance element (such as a field effect capacitor) of an appropriate capacitance value disposed on-board the integrated circuit. One lead of the capacitance element is coupled to the input lead of the gain stage of the Pierce oscillator circuit whereas a second lead of the capacitance element is coupled to the output lead of the gain stage. Providing the capacitance element facilitates oscillator startup and reliability by effectively eliminating the upper gain limit for oscillation. Specific circuit embodiments are also disclosed.

12 Claims, 3 Drawing Sheets

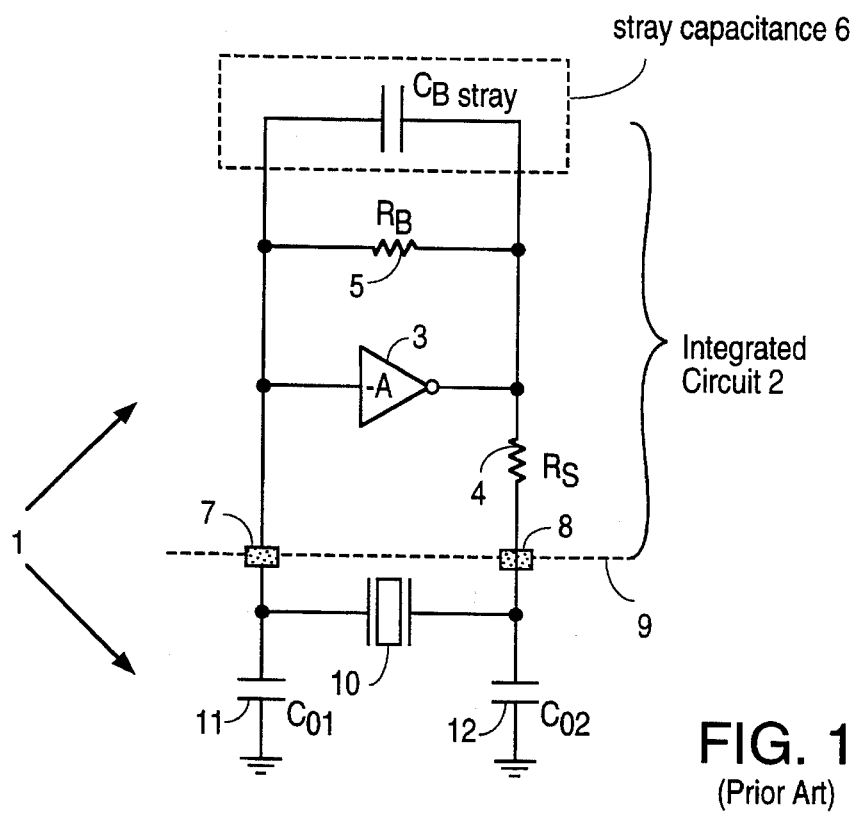

PIERCE CRYSTAL OSCILLATOR HAVING RELIABLE STARTUP FOR INTEGRATED CIRCUITS

FIELD OF THE INVENTION

This invention relates to crystal oscillator circuits for integrated circuits.

BACKGROUND INFORMATION

Low-power crystal oscillator circuits are commonly used on digital integrated circuits to generate relatively low frequency digital clock signals. Typically the gain stage of the oscillator circuit is disposed on the integrated circuit whereas the crystal of the oscillator circuit is external to the package containing the integrated circuit.

FIG. 1 (Prior Art) is a circuit diagram of a low-power crystal oscillator circuit called a Pierce oscillator. Pierce oscillator 1 of integrated circuit 2 includes an inverting gain stage 3, a first resistor 4, a second resistor 5, a stray capacitance 6 and two terminals 7 and 8. The dashed line 9 indicates the boundary of the integrated circuit 2. A crystal 10 and two discrete capacitors 11 and 12 external to the integrated circuit are connected to terminals 7 and 8 in a pi configuration. The ability of the oscillator circuit to startup is dependent upon the magnitude of the stray capacitance 6. Moisture, terminal placement, package type and socket type affect the magnitude of the stray capacitance and therefore tend to make the oscillator circuit unreliable.

SUMMARY

A Pierce crystal oscillator circuit for a digital integrated circuit has a capacitance element (such as a field effect capacitor) of an appropriate capacitance value disposed on-board the integrated circuit. One lead of the capacitance element is coupled to the input lead of the gain stage of the Pierce oscillator circuit whereas a second lead of the capacitance element is coupled to the output lead of the gain stage. Providing the capacitance element facilitates oscillator startup and reliable operation. The capacitance element has a value $C_{Badded}$ given by the following equation:

$$C_{Badded} > \frac{1}{(2\pi f_c)^2 R_B C_0 R_S} \quad (1)$$

Specific circuit embodiments are also disclosed. This summary does not purport to define the invention. The invention is defined by the appended claims.

BRIEF DESCRIPTION OF THE DRAWINGS

FIG. 1 (Prior Art) is a simplified diagram of a Pierce crystal oscillator circuit.

FIG. 2 is a simplified diagram of an oscillator circuit in accordance with an embodiment of the present invention.

DETAILED DESCRIPTION OF THE PREFERRED EMBODIMENTS

Figure 3:
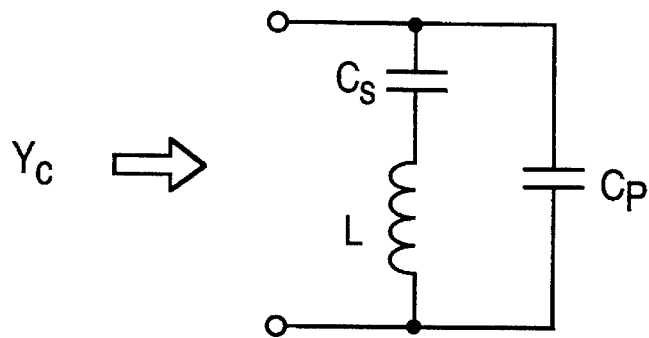
FIG. 3 illustrates a circuit model of a crystal.

FIG. 2 is a simplified diagram of an oscillator circuit 100 in accordance with an embodiment of the present invention. Oscillator circuit 100 includes an inverting gain stage 101 of gain $-A$, a first resistance element 102 of resistance $R_S$, a second resistance element 103 of resistance $R_B$, a capacitance element 104 of capacitance $C_{Badded}$, an external crystal 105, a first external capacitor 106 of capacitance $C_{o1}$, and a second external capacitor 107 of capacitance $C_{o2}$. Dashed line 108 indicates the boundary of the integrated circuit 109 upon which the inverting gain stage is formed. Terminals 110 and 111 are terminals of the integrated circuit 109. The stray capacitance 112 of magnitude $C_{Bstray}$ inherently exists between the input lead and the output lead of the inverting gain stage.

Integrated circuit 109 is assumed to be packaged (in, for example, a plastic package a ceramic package). The portion of the connections between the integrated circuit 109 and the external circuit components below dashed line 108 due to packaging (for example, wire bonds) are considered to be part of the illustrated connections to terminals 110 and 111 below dashed line 108. Resistance elements 102 and 103 may be realized as any suitable structure including thin film metal resistors, thin film polysilicon resistors, and resistors made of diffusion. Inverting gain stage 101 may be either a single stage or a multi-stage amplifier. External capacitors 106 and 107 may be discrete capacitors of any suitable construction including mica, ceramic, tantalum, and mylar. Generally $C_{o1} \approx C_{o2}$.

Capacitance element 104 is provided in the oscillator circuit to provide an adequately large capacitance $C_B$ to facilitate oscillator startup by effectively eliminating the upper gain limit for oscillation ($C_B = C_{Bstray} + C_{Badded}$). The value of capacitance $C_{Badded}$ may be determined as explained below in connection with equations 2–20.

FIG. 3 illustrates a model of a quartz crystal. The admittance $Y_c$ of the modeled crystal is given by the equation:

$$Y_c = \frac{s(C_S + C_P) + s^3 L C_S C_P}{1 + s^2 L C_S} \quad (2)$$

Figure 4:
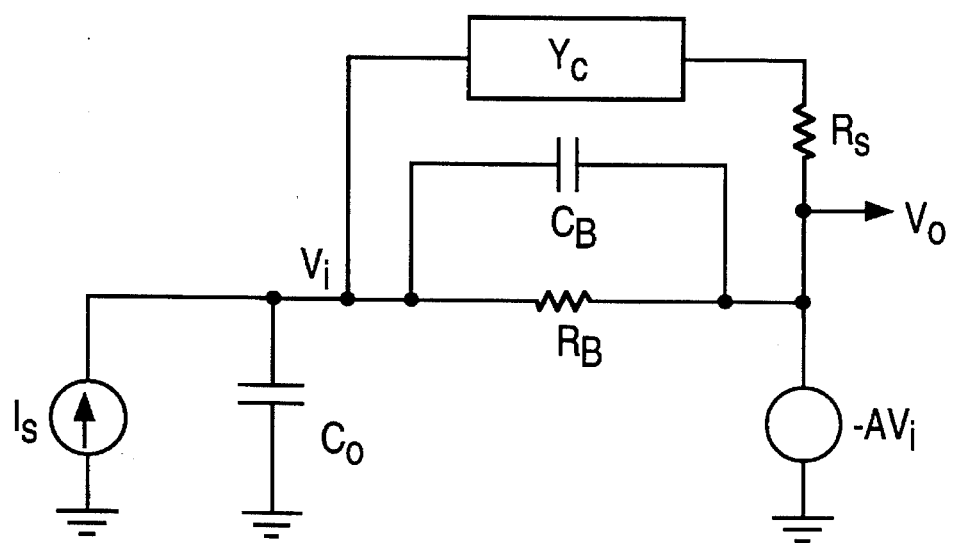
FIG. 4 illustrates a circuit model for modeling operation of the circuit of FIG. 2.

FIG. 4 illustrates a circuit model for modeling operation of the circuit of FIG. 2. The circuit model is developed by substituting the model of FIG. 3 for crystal 105 of FIG. 2, by modeling the gain stage 101 of FIG. 2 as a dependent voltage source $-AV_i$, and by providing a noise current source $I_s$. The node voltage matrix of the circuit model of FIG. 4 is:

$$\begin{bmatrix} sC_0 + (1+A)\left[\frac{1}{R_B} + sC_B\right] + Y_C & -Y_C \\ -Y_C + \frac{A}{R_S} & sC_0 + Y_C + \frac{1}{R_S} \end{bmatrix} \begin{bmatrix} V_i \\ V_x \end{bmatrix} = \begin{bmatrix} I_S \\ 0 \end{bmatrix} \quad (3)$$

The system transfer function therefore is:

$$\frac{V_o}{I_s} = \quad (4)$$

$$\frac{A\left(sC_O + Y_C + \frac{1}{R_S}\right)}{\det\begin{bmatrix} sC_0 + (1+A)\left[\frac{1}{R_B} + sC_B\right] + Y_C & -Y_C \\ -Y_C + \frac{A}{R_S} & sC_O + Y_C + \frac{1}{R_S} \end{bmatrix}}$$

It is understood from control system theory that the necessary and sufficient condition that a feedback system be stable is that all the poles of its transfer function have negative real parts. This condition implies that the roots of:

$$\det\begin{bmatrix} sC_0 + (1+A)\left[\frac{1}{R_B} + sC_B\right] + Y_C & -Y_C \\ -Y_C + \frac{A}{R_S} & sC_O + Y_C + \frac{1}{R_S} \end{bmatrix} = 0 \quad (5)$$

must have at least one positive real part in order for the described system to start oscillating. The polynomial represented by equation 5 can be obtained by expanding the determinant and substituting for $Y_c$. This yields:

$$P_4 s^4 + P_3 s^3 + P_2 s^2 + P_1 s^1 + P_0 s^0 = 0 \quad (6A)$$

where:

$$P_4 = LC_S[C_0^2 + (1+A)(C_0 + C_P)C_B + 2C_0 C_P] \quad (6B)$$

$$P_3 = LC_S\left\{\left(\frac{1+A}{R_S R_B}\right)[C_B R_B + C_0 R_S] + (1+A)C_P\left[\frac{1}{R_S} + \frac{1}{R_B}\right] + \frac{C_0}{R_S}\right\} \quad (6C)$$

$$P_2 = C_0^2 + \left(\frac{1+A}{R_S R_B}\right)[C_0 C_B R_S R_B + LC_S] + (C_S + C_P)[2C_0 + (1+A)C_B] \quad (6D)$$

$$P_1 = \left(\frac{1+A}{R_S R_B}\right)[C_B R_B + C_0 R_S + (R_B + R_S)(C_S + C_P)] + \frac{C_0}{R_S} \quad (6E)$$

$$P_0 = \frac{1+A}{R_S R_B} \quad (6F)$$

Although there is no closed solution for the roots of this polynomial, the Routh-Hurwitz method for finding the roots can be utilized. Applying the Routh-Hurwitz method, an array of coefficients is obtained from equations 6A–6F:

$$\begin{array}{ccc} P_4 & P_2 & P_0 \\ P_3 & P_1 & \\ Q_1 & Q_2 & \\ T_1 & & \end{array} \quad (7A)$$

where:

$$Q_1 = -\frac{1}{P_3}\begin{vmatrix} P_4 & P_2 \\ P_3 & P_1 \end{vmatrix} \quad (7B)$$

$$Q_2 = -\frac{1}{P_3}\begin{vmatrix} P_4 & P_0 \\ P_3 & 0 \end{vmatrix} \quad (7C)$$

$$T_1 = -\frac{1}{Q_1}\begin{vmatrix} P_3 & P_1 \\ Q_1 & Q_2 \end{vmatrix} \quad (7D)$$

The Routh-Hurwitz criterion indicates that the system is stable if and only if all the elements in the first column of the array (i.e., $P_4$, $P_3$, $Q_1$, $T_1$) all have the same algebraic sign. Because the system is to be unstable (i.e., to oscillate), relationships are developed for circuit parameters that cause a change in algebraic sign for $P_4$, $P_3$, $Q_1$, or $T_1$. From inspection of equations 6B and 6C, it is seen that $P_4$ and $P_3$ will always be positive for all positive values of circuit parameters (i.e., A, $R_B$, $C_o$, L...). The system will therefore oscillate if $Q_1$ or $T_1$ are made negative. Because useful information is generally not obtained by attempting to make $Q_1$ negative, attention is focused upon $T_1$. It is observed that:

$$Q_1 = -\frac{1}{P_3}\begin{vmatrix} P_4 & P_2 \\ P_3 & P_1 \end{vmatrix} = \frac{P_2 P_3 - P_1 P_4}{P_3} \quad (8)$$

$$\text{and } Q_2 = -\frac{1}{P_3}\begin{vmatrix} P_4 & P_0 \\ P_3 & 0 \end{vmatrix} = \frac{P_4 \cdot 0 - P_0 P_3}{-P_3} = P_0 \quad (9)$$

$$\text{therefore } T_1 = -\frac{1}{Q_1}\begin{vmatrix} P_3 & P_1 \\ Q_1 & P_0 \end{vmatrix} = \frac{P_1 Q_1 - P_3 P_0}{Q_1} \quad (10)$$

Because the objective is to minimize or eliminate the upper gain limit for oscillation, the problem is simplified by looking at $Q_1$ and $T_1$ as $A \to \infty$. Dividing each coefficient by A and letting $A \to \infty$ yields:

$$P_4 \to P_4' = LC_S C_B (C_0 + C_P) \quad (11A)$$

$$P_3 \to P_3' = LC_S\left\{\frac{C_B R_B + C_0 R_S}{R_S R_B} + C_P\left[\frac{1}{R_S} + \frac{1}{R_B}\right]\right\} \quad (11B)$$

$$P_2 \to P_2' = \frac{1}{R_S R_B}[C_0 C_B R_S R_B + LC_S] + C_B(C_S + C_P) \quad (11C)$$

$$P_1 \to P_1' = \frac{1}{R_S R_B}[C_B R_B + C_0 R_S + (R_B + R_S)(C_S + C_P)] \quad (11D)$$

$$P_0 \to P_0' = \frac{1}{R_S R_B} \quad (11E)$$

Substituting the P' values for $Q_1$ reveals:

$$Q_1' = \frac{P_2' P_3' - P_1' P_4'}{P_3'} < 0 \text{ for oscillation} \quad (12)$$

$$P_2' P_3' - P_1' P_4' < 0 \text{ (since } P_3' > 0\text{)} \quad (13)$$

Substituting circuit parameters and simplifying yields:

$$R_B C_B C_S (C_B - C_O) + \frac{LC_S}{R_S R_B}[R_B(C_B + C_P) + R_S(C_O + C_P)] < 0 \quad (14)$$

The inequality of equation 14 is not, however, generally maintained when typical circuit values are employed. $Q_1$ is therefore assumed to be positive. Assuming that $Q_1$ is positive, equation 10 becomes:

$$T_1 = \frac{P_1' Q_1' - P_3' P_0'}{Q_1'} < 0 \quad (15)$$

or $$P_1' Q_1' - P_3' P_0' < 0 \quad (16)$$

Substituting circuit parameters and simplifying yields:

$$R_B C_B (C_B - C_O) + \frac{LC_S}{R_S R_B}[R_B + R_S] < 0 \text{ for oscillation} \quad (17)$$

If, $R_B \gg R_s$ and $C_o \gg C_B$, equation 17 becomes:

$$-R_B C_B C_O + \frac{LC_S}{R_S} < 0 \quad (18)$$

Solving for $C_B$ yields:

$$C_B > \frac{LC_S}{R_S R_B C_O} \text{ for oscillation as } A \to \infty \quad (19A)$$

$$\text{or } C_B > \frac{1}{(2\pi f_C)^2 R_S R_B C_O} \quad (19B)$$

$$\text{where } f_C = \frac{1}{2\pi \sqrt{LC_S}} = \text{crystal series resonance frequency} \quad (19C)$$

Accordingly, making $C_B$ meet the condition of equation 19B effectively eliminates the upper gain limit for oscillation. To ensure that $C_B$ is adequately large in the embodiment of FIG. 2 despite the variable capacitance $C_{Bstray}$, capacitance element 104 is sized so that:

$$C_{Badded} > \frac{1}{(2\pi f_C)^2 R_S R_B C_O} \quad (20)$$

Component values in accordance with a specific embodiment which oscillates at frequency 32,768 Hz are set forth in Table I below:

TABLE I

| Component | Approximate Value |
| --- | --- |
| $R_S$ | 120 kΩ |
| $R_B$ | 10 MΩ |
| $C_{Badded}$ | 1 pF |
| A | >10 |
| $C_{O1}$ | 20 pF |
| $C_{O2}$ | 20 pF |

Figure 5:
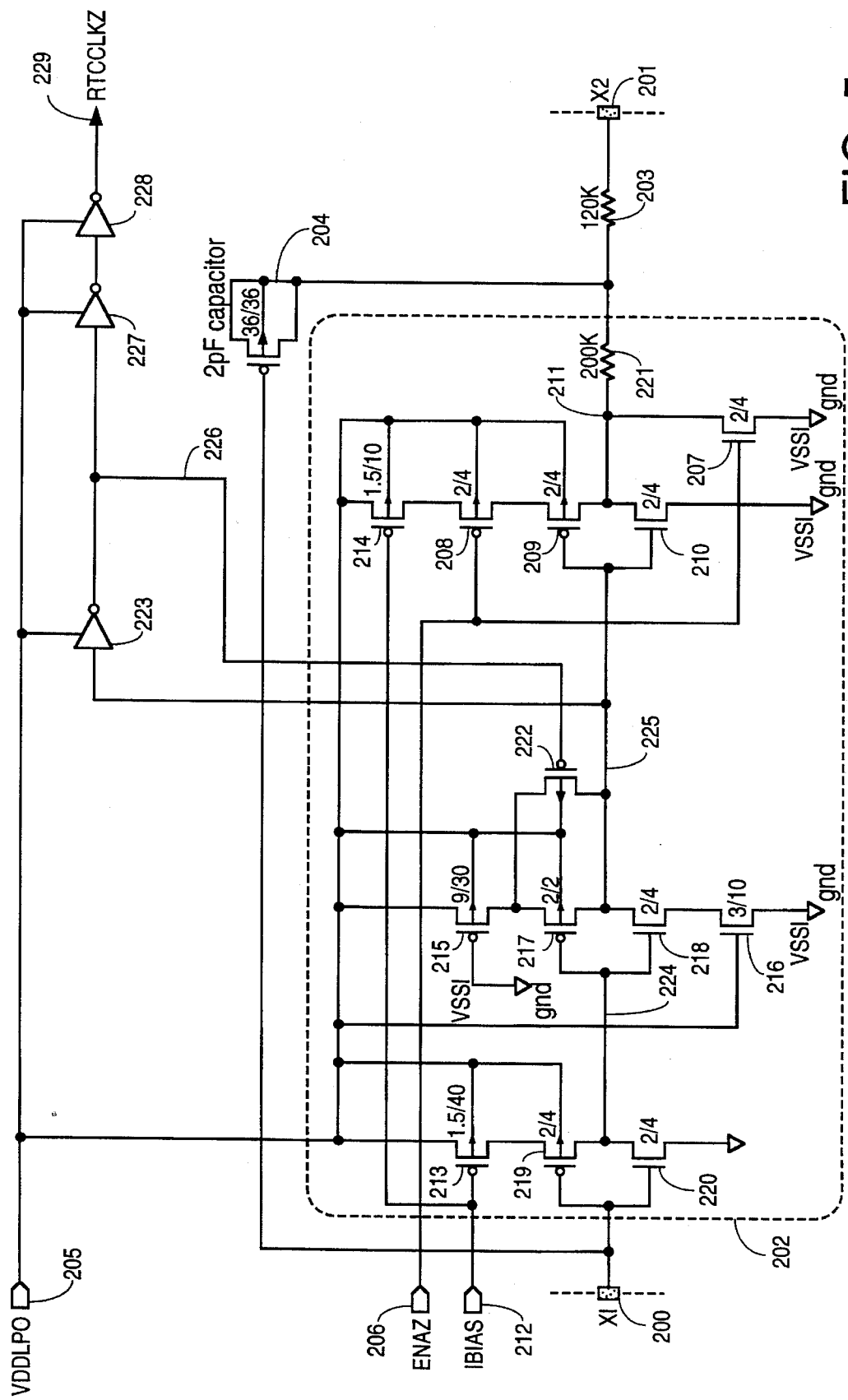
FIG. 5 is a simplified transistor level diagram in accordance with another embodiment of the present invention.

FIG. 5 is a simplified transistor level diagram of a specific embodiment realized on an integrated circuit. Terminal X1 200 and terminal X2 201 of FIG. 5 correspond with terminals 110 and 111 of FIG. 2. Inverting gain stage 202 of FIG. 5 corresponds with inverting gain stage 101 of FIG. 2. Resistance element 203 of FIG. 5 corresponds with resistance element 102 of FIG. 2. Capacitance element 204 of FIG. 5 corresponds with capacitance element 104 of FIG. 2. Input lead VDDLPO 205 provides a supply voltage in the range of 1.6–6.0 volts to the oscillator circuit. Input lead ENAZ 206 is an active low enable input lead. When the enable signal on input lead ENAZ is at a digital high, N-channel field effect transistor 207 is conductive and P-channel field effect transistor 208 is nonconductive. The high voltage supply to the stage made up of transistors 209 and 210 is disconnected and the output lead 211 is coupled to ground. The inverting gain stage 202 is therefore disabled.

Input lead 212 is coupled to a current mirror (not shown) to provide a voltage bias to P-channel field effect transistors 213 and 214. The supply current through transistors 213 and 214 is therefore controlled by the voltage on lead 212. The gate of P-channel transistor 215, on the other hand, is grounded and the supply current through this transistor is not controlled. Unless the voltage on input lead VDDLPO 205 is high, N-channel transistor 216 is nonconductive thereby preventing current flow through the stage made up of transistors 217 and 218. It is therefore seen that the inverter gain stage 202 is in turn made up of a first gain stage including transistors 219 and 220, a second gain stage including transistors 217 and 218, and a third gain stage including transistors 209 and 210. Resistor 221 is provided to limit the bandwidth of the oscillator circuit.

Hysteresis is provided by P-channel transistor 222 and inverter 223. When the voltage on the input lead 224 of the second stage falls to the voltage at which transistors 217 and 218 cause the voltage on output lead 225 to rise to the switching voltage of inverter 223, inverter 223 switches and forces the voltage on lead 226 low. The low voltage on lead 226 turns P-channel transistor 222 on thereby pulling the voltage on output lead 225 upward for the same voltage on input lead 224. To pull the voltage on output lead 225 down to the switching voltage of inverter 223, the voltage on input lead 224 must be adequately high that N-channel transistor 218 is adequately conductive that it overcomes the pullup effect of both transistors 217 and 222.

Inverters 227 and 228 buffer the oscillator clock signal and supply the clock signal onto output lead RTCCLKZ 229. In some embodiments, a resistor corresponding roughly with resistance element $R_B$ is provided external to the integrated circuit and is coupled to terminals 200 and 201. In other embodiments, a resistance element corresponding with resistance element $R_B$ is provided on the integrated circuit, one lead being coupled to the input lead of inverting gain stage 202, the other lead being coupled either to the output lead of inverting gain stage 202 or to terminal 201.

Although certain specific exemplary embodiments are described above in order to illustrate the invention, the invention is not limited to the specific embodiments. The present invention does not depend upon the specific derivation presented above. The derivation is presented only for informational purposes. Any suitable structure having a capacitance can be used to implement capacitance element $C_{Badded}$. Accordingly, various modifications, adaptations and combinations of various features of the specific embodiments are within the scope of the claimed invention as set forth in the appended claims.

I claim:

1. A circuit, comprising:
    an integrated circuit, said integrated circuit comprising:
        an inverting gain stage having an input lead and an output lead;
        a first resistance element having a first lead and a second lead, said first lead of said first resistance element being coupled to said output lead of said inverting gain stage;
        a first terminal of said integrated circuit coupled to said input lead of said inverting gate stage;
        a second terminal of said integrated circuit coupled to said second lead of said first resistance element;
        a second resistance element having a first lead and a second lead said first lead of said second resistance element being coupled to said input lead of said inverting gain stage, said second lead of said second resistance element being coupled to said output lead of said inverting gain stage; and a capacitance element having a first lead and a second lead, said first lead of said capacitance element being coupled to said input lead of said inverting gain stage, said second lead of said capacitance element being coupled to said output lead of said inverting gain stage; and a first external capacitor having a lead coupled to said first terminal of said integrated circuit;

a second external capacitor of capacitance $C_o$ having a lead coupled to said second terminal of said integrated circuit; and a crystal having a first lead and a second lead, said first lead of said crystal being coupled to said first terminal of said integrated circuit, said second lead of said crystal being coupled to said second terminal of said integrate circuit, wherein said first resistance element has a resistance $R_S$, said second resistance element has a resistance $R_B$, and said capacitance element having a capacitance $C_{Badded}$, wherein:

$$C_{Badded} > \frac{1}{(2\pi f_c)^2 R_B C_O R_S},$$

$f_c$ being the series resonance frequency of the crystal, $f_c$ being less than 1 MHz.

2. The circuit of claim 1, wherein said capacitance element is a field effect capacitor having a first plate and a second plate, said first plate being a layer of polysilicon, said second plate being a diffusion region, said layer of polysilicon being insulated from said diffusion region by a layer of oxide.

3. The circuit of claim 1, wherein said capacitance element has a capacitance of at least 2 pF.

4. The circuit of claim 1, wherein said inverting gain stage comprises:

a first inverting gain stage having an input lead and an output lead;

a second inverting gain stage having an input lead and an output lead, said input lead of said second inverting gain stage being coupled to said output lead of said first inverting gain stage;

a third inverting gain stage having an input lead and an output lead, said input lead of said third inverting gain stage being coupled to said output lead of said second inverting gain stage; and a resistance element having a first lead and a second lead, said first lead of said resistance element of said inverting gate stage being coupled to said output lead of said third inverting gain stage, said second lead of said resistance element of said inverting gate stage being said output lead of said inverting gain stage of said integrated circuit.

5. The circuit of claim 4, wherein said resistance element of said inverting gain stage has a resistance in the range of 160–240 kΩ.

6. The circuit of claim 1, wherein said inverting gain stage has an enable input lead.

7. The circuit of claim 1, wherein said inverting gain stage has a hysteresis characteristic.

8. The circuit of claim 1, wherein said first resistance element comprises a diffusion region.

9. The circuit of claim 8, wherein said first resistance element has a resistance in the range of 80–160 kΩ.

10. A pierce oscillator circuit disposed on an integrated circuit, comprising:

a first oscillator terminal;

a second oscillator terminal;

an inverting gain stage having an input lead and an output lead, said input lead of said inverting gain stage being coupled to said first oscillator terminal; and means for facilitating start up oscillation in said oscillator circuit by providing a capacitance of at least 2 pF between said input lead of said inverting gain stage and said output lead of said inverting gain stage, wherein said start up oscillation has a frequency of less than 1 MHz.

11. The pierce oscillator circuit of claim 10, wherein said means for facilitating start up oscillation is a field effect capacitor.

12. An oscillator circuit comprising:

a first terminal of an integrated circuit;

a second terminal of said integrated circuit;

a crystal having a first lead and a second lead, said first lead of said crystal being coupled to said first terminal, said second lead of said crystal being coupled to said second terminal;

a first capacitor of capacitance $C_o$ having a first lead and a second lead, said first lead of said first capacitor being coupled to said first terminal;

a second capacitor having a first lead and a second lead, said first lead of said second capacitor being coupled to said second terminal;

a first resistance element having a first lead and a second lead, said first lead of said first resistance element being coupled to said second terminal;

an inverting gain stage having an input lead and an output lead, said input lead of said inverting gain stage being coupled to said first terminal, said output lead of said integrated circuit being coupled to said second lead of said first resistance element;

a second resistance element of resistance $R_B$ having a first lead and a second lead, said first lead of said second resistance element being coupled to said first terminal, said second lead of said second resistance element being coupled to said second terminal; and a capacitance element of capacitance $C_{Badded}$ having a first lead and a second lead, said first lead of said capacitance element being coupled to said input lead of said inverting gain stage, said second lead of said capacitance element being coupled to said output lead of said inverting gain stage, wherein the oscillating frequency of the oscillator circuit is less than 1 MHz, $C_{Badded} \geq 1$ pF, $C_o \leq 30$ pF, and $R_B \geq 1$ MΩ.

* * * * *